(12) United States Patent
Park et al.

(10) Patent No.: US 9,214,509 B2
(45) Date of Patent: Dec. 15, 2015

(54) DISPLAY DEVICE

(71) Applicant: SAMSUNG DISPLAY CO., LTD., Yongin, Gyeonggi-Do (KR)

(72) Inventors: Kyong-Tae Park, Yongin (KR); Dong-Gyu Kim, Yongin (KR); Sung-Jae Moon, Yongin (KR)

(73) Assignee: SAMSUNG DISPLAY CO., LTD., Yongin, Gyeonggi-Do (KR)

( * ) Notice: Subject to any disclaimer, the term of this patent is extended or adjusted under 35 U.S.C. 154(b) by 0 days.

(21) Appl. No.: 14/278,052

(22) Filed: May 15, 2014

(65) Prior Publication Data

US 2014/0353632 A1    Dec. 4, 2014

(30) Foreign Application Priority Data

May 31, 2013    (KR) .......................... 10-2013-0062659

(51) Int. Cl.
*H01L 29/08*    (2006.01)
*H01L 27/32*    (2006.01)

(52) U.S. Cl.
CPC ........ *H01L 27/3279* (2013.01); *H01L 27/3276* (2013.01); *H01L 27/3288* (2013.01); *H01L 27/3297* (2013.01)

(58) Field of Classification Search
CPC .................... H01L 51/0545; H01L 27/3279
USPC .......................................................... 257/40
See application file for complete search history.

(56) References Cited

U.S. PATENT DOCUMENTS 6,104,465 A    8/2000  Na et al.
6,133,693 A *  10/2000 Keyser ........................ 313/506
2003/0117540 A1    6/2003  Park et al.
2004/0135956 A1    7/2004  Kim et al.
2005/0098785 A1    5/2005  You
2008/0231165 A1    9/2008  Lee
2010/0112887 A1    5/2010  Kim et al.
2011/0025671 A1    2/2011  Lee
2011/0157144 A1 * 6/2011  Park et al. ..................... 345/212

(Continued)

FOREIGN PATENT DOCUMENTS

| EP | 1975688 A1 | 10/2008 |
|---|---|---|
| KR | 10-0712293 B1 | 4/2007 |
| KR | 10-2010-0048412 A | 5/2010 |
| KR | 10-2011-0013693 A | 2/2011 |

(Continued)

OTHER PUBLICATIONS

European Search Report dated Jan. 19, 2015.

*Primary Examiner* — Fernando L Toledo
*Assistant Examiner* — Neil Prasad
(74) *Attorney, Agent, or Firm* — Lee & Morse, P.C.

(57) ABSTRACT

A display device includes a pixel unit including a plurality of pixels coupled to a plurality of control lines and to a plurality of power lines to commonly receive same control signals and power source, a plurality of inlet pads positioned outside the pixel unit, the plurality of inlet pads being configured to apply the power source to the plurality of power lines, a pad bar electrically coupling the plurality of inlet pads, and a plurality of coupling patterns contacting end portions of the plurality of power lines and corresponding end portions of the pad bar, the plurality of coupling patterns electrically connecting the plurality of power lines and the pad bar, and one or more of the end portions of the pad bar and the ends portions of the plurality of power lines have different contact areas with the plurality of coupling patterns.

20 Claims, 5 Drawing Sheets

(56) References Cited

U.S. PATENT DOCUMENTS

2014/0091992 A1  4/2014  Lee et al.
2014/0320476 A1  10/2014  Choi et al.

FOREIGN PATENT DOCUMENTS

KR  10-2014-0042183 A  4/2014
KR  10-2014-0129628 A  11/2014

* cited by examiner

DISPLAY DEVICE

CROSS-REFERENCE TO RELATED APPLICATION

Korean Patent Application No. 10-2013-0062659, filed on May 31, 2013, in the Korean Intellectual Property Office, and entitled: "Display Device," is incorporated by reference herein in its entirety.

BACKGROUND

1. Field

An aspect of embodiments relates to a display device.

2. Description of the Related Art

Among display devices, an organic light emitting display device displays images using organic light emitting diodes that emit light through recombination of electrons and holes. The organic light emitting display device has a fast response speed and is driven with low power consumption. Hence, the organic light emitting display device has come into the spotlight as a next-generation display device.

Generally, an organic light emitting display device includes a pixel unit configured to include a plurality of pixels, a driving circuit configured to supply a driving signal to the pixel unit, a control circuit configured to supply a control signal to the pixel unit, and a power supply circuit configured to supply power to the pixel unit. When a scan signal is supplied to each pixel, each pixel emits light with luminance corresponding to a data signal supplied in synchronization with the scan signal. Accordingly, the organic light emitting display device displays a predetermined image.

SUMMARY

According to embodiments, there is provided a display device, including a pixel unit including a plurality of pixels, the plurality of pixels being coupled to a plurality of control lines and to a plurality of power lines to commonly receive same control signals and power source, a plurality of inlet pads positioned outside the pixel unit, the plurality of inlet pads being configured to apply the power source to the plurality of power lines, a pad bar electrically coupling the plurality of inlet pads, and a plurality of coupling patterns contacting end portions of the plurality of power lines and corresponding end portions of the pad bar, the plurality of coupling patterns electrically connecting the plurality of power lines and the pad bar, and one or more of the end portions of the pad bar and the ends portions of the plurality of power lines have different contact areas with the plurality of coupling patterns.

The contact area may be formed smallest in the coupling pattern closest to the inlet pad. The contact area may become small as the coupling pattern is close to the inlet pad.

The contact area may be formed largest in the coupling pattern most distant from the inlet pad. The contact area may become large as the coupling pattern is distant from the inlet pattern.

The coupling patterns may be formed of a material having resistance greater than that of the pad bar and the power lines. The material forming the coupling patterns may be a doped semiconductor.

The one or more of the end portion of the pad bar and the ends portions of the plurality of power lines, which are respectively contacted with the coupling patterns, may be formed in a step shape in which the contact area is gradually increased from a region close to the inlet pad to a region distant from the inlet pad.

The power source may be an initialization power source commonly applied to the plurality of pixels.

The display device may include a plurality of inlet pads positioned at the outside of the pixel unit to respectively apply control signals to the plurality of control lines, a pad bar configured to allow the inlet pads to be coupled therethrough; and a plurality of coupling patterns respectively contacted with an end portion of the pad bar and end portions of a plurality of control lines to allow the inlet pads and the control lines to be electrically coupled therethrough, wherein one or more of the end portion of the pad bar and the ends portions of the plurality of control lines, which are respectively contacted with the coupling patterns, have different contact areas for each plurality of patterns.

The coupling patterns may be formed of a material having resistance greater than that of the pad bar and the control lines. The one or more of the end portion of the pad bar and the ends portions of the plurality of control lines, which are respectively contacted with the coupling patterns, may be formed in a step shape in which the contact area is gradually increased from a region close to the inlet pad to a region distant from the inlet pad.

The pixel may include an organic light emitting diode configured to have a cathode electrode coupled to a second power source; a first transistor coupled between a data line and a first node, the first transistor being turned on when a scan signal is supplied to a scan line; a first capacitor coupled between the first node and an initialization power source; and a pixel circuit configured to control the amount of current flowing from a first power source to the second power source via the organic light emitting diode, corresponding to a voltage applied to the first node.

The pixel circuit may include a third transistor coupled between the first node and a third node, the third transistor having a turn-on period not overlapped with that of the first transistor; a second transistor configured to control the amount of current from the first power source coupled via the third node to the organic light emitting diode coupled via a fourth node, corresponding to a voltage applied to a second node; a fourth transistor coupled between the second and fourth nodes, the fourth transistor being simultaneously turned on or turned off with the third transistor; and a storage capacitor coupled between the second node and the first power source.

The pixel circuit may further include a fifth transistor coupled between the second node and the initialization power source, the fifth transistor having a turn-on period not overlapped with those of the first and third transistors; a sixth transistor coupled between the third node and the first power source, the sixth transistor being simultaneously turned on or turned off with the fifth transistor; a seventh transistor coupled in parallel to the sixth transistor between the third node and the first power source, the seventh transistor having a turn-on period overlapped with that of the first transistor; and an eighth transistor coupled between the fourth node and the organic light emitting diode, the eighth transistor being simultaneously turned on or turned off with the seventh transistor.

BRIEF DESCRIPTION OF THE DRAWINGS

Features will become apparent to those of ordinary skill in the art by describing in detail exemplary embodiments with reference to the attached drawings, in which.

DETAILED DESCRIPTION

Figure 1:
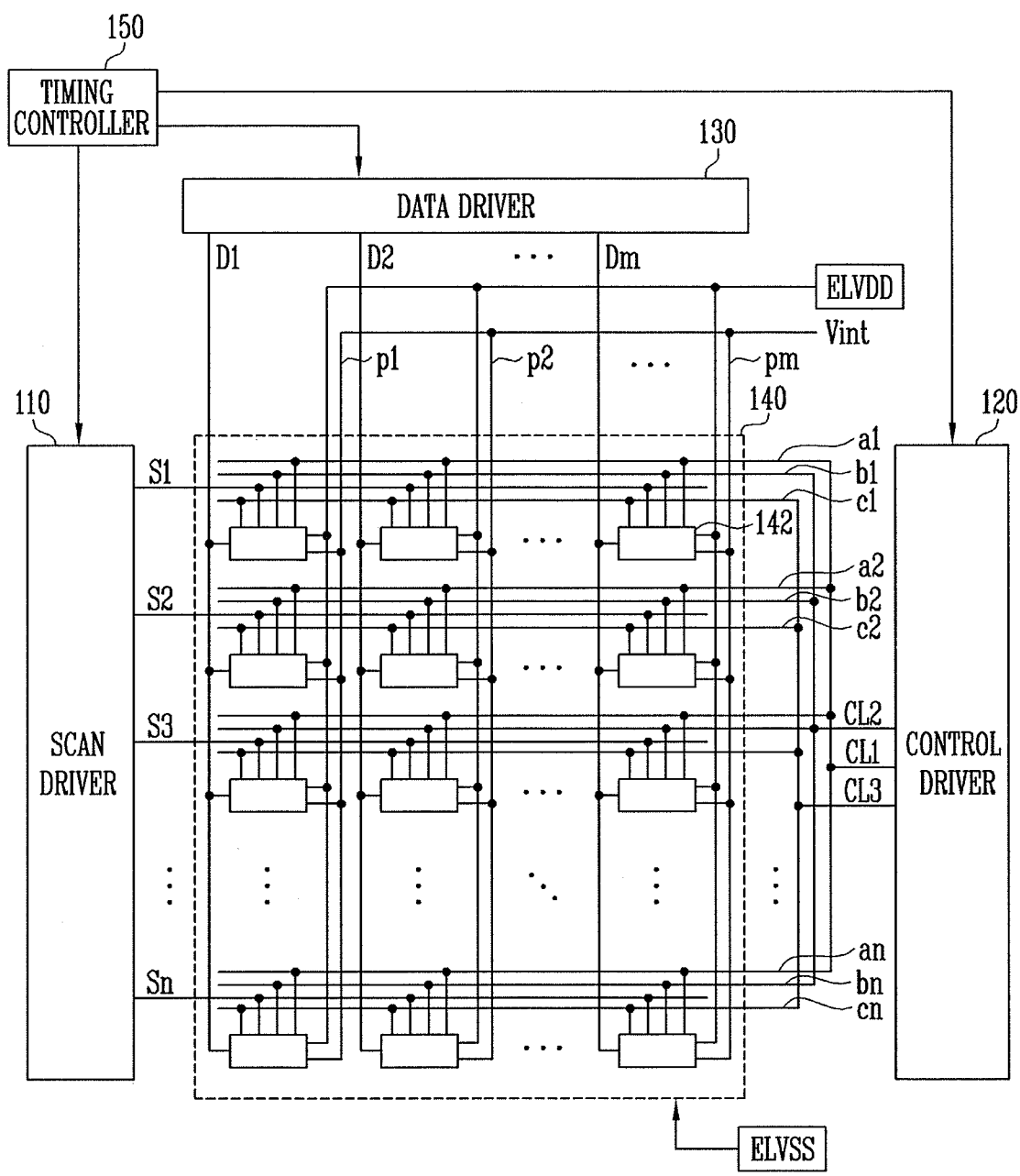
FIG. 1 illustrates a block diagram of a display device according to an embodiment.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, dimensions of layers and regions may be exaggerated for clarity of illustration. It will be understood that when an element is referred to as being "between" two elements, it can be the only element between the two elements, or one or more intervening elements may also be present. Also, when an element is referred to as being "coupled to" another element, it can be not only directly coupled to the other element but may also be indirectly coupled to the other element via an intervening element. Further, some of the elements that are not essential to the complete understanding of the embodiments are omitted for clarity. Also, like reference numerals refer to like elements throughout.

FIG. 1 illustrates a block diagram of a display device according to an embodiment.

Referring to FIG. 1, a display device according to an embodiment may include a pixel unit 140 configured to include pixels 142 positioned in an area defined by scan lines S1 to Sn and data lines D1 to Dm, a scan driver 110 configured to drive the scan lines S1 to Sn, a control driver 120 configured to drive first control lines a1 to an, second control lines b1 to bn, and third control lines c1 to cn as emission control lines, which are commonly coupled to the pixels 142, a data driver 130 configured to drive the data lines D1 to Dm, and a timing controller 150 configured to control the drivers 110, 120 and 130.

In this case, a first control signal CL1 is commonly applied to the first control lines a1 to an, and a second control signal CL2 is commonly applied to the second control lines b1 to bn. In addition, a third control signal CL3 is commonly applied to the third control lines c1 to cn.

First and second power sources ELVDD and ELVSS as pixel power sources, and an initialization power source Vint for initializing a gate electrode of a driving transistor in each pixel 142, are applied to the pixels 142. In this case, the initialization power source Vint is commonly applied to the pixels 142 respectively through a plurality of initialization power lines p1 to pm. The first power source ELVDD is set to a high-level voltage, and the second power source ELVSS is set to a low-level voltage.

For example, the first power source ELVDD may have a positive voltage level of 15V, and the second power source ELVSS may have a negative voltage level of (−5) V or a ground voltage level of 0V. The initialization power source Vint may have a ground voltage level of 0V as a voltage lower than that of a data signal.

In this embodiment, the scan driver 110 progressively supplies a scan signal to the scan lines S1 to Sn during a third period (T3 of FIG. 3) in one frame. If the scan signal is progressively supplied to the scan lines S1 to Sn, pixels 142 are selected for each horizontal line.

The control driver 120 or the scan driver 110 supplies an emission control signal to the third control lines c1 to cn, i.e., emission control lines, during first and second periods (T1 and T2 of FIG. 3) except the third period T3 in the one frame.

Here, the scan signal is set to a voltage at which transistors included in the pixels 142 can be turned on, and the third control signal CL3 as the emission control signal is set to a voltage at which the transistors included in the pixels 142 can be turned off. Thus, the pixels 142 are set in a non-emission state during the first and second periods, i.e., when the emission control signal is supplied to the third control lines c1 to cn. That is, in an embodiment in which the transistors are implemented as P-type transistors, the scan signal is set to a low-level voltage, and the emission control signal is set to a high-level voltage.

The data driver 130 supplies a data signal to the data lines D1 to Dm, in synchronization with the scan signal. Then, the data signal is supplied to the pixels 142 selected by the scan signal.

The control driver 120, as described above, supplies the emission control signal to the third control lines c1 to cn as the emission control lines during the first and second periods T1 and T2, except the third period T3 in the one frame. In addition, the control driver 120 supplies the first control signal CL1 to the first control lines a1 to an during the first period T1 in the one frame, and supplies the second control signal CL2 to the second control lines b1 to bn during the second period T2 in the one frame. Here, the first and second control signals CL1 and CL2 are set to a voltage at which the transistors included in the pixels 142 can be turned on. That is, in the embodiment in which the transistors are implemented as the P-type transistors, the first and second control signals CL1 and CL2 are set to a low-level voltage.

The pixels 142 are positioned at intersection portions of the scan lines S1 to Sn and the data lines D1 to Dm. The pixels 142 are initialized during the first period T1 in the one frame, and compensate for the threshold voltage of the driving transistor during the second period T2 in the one frame. The pixels 142 are charged with a voltage corresponding to the data signal while emitting light during the third period T3.

Here, all the pixels 142 included in the pixel unit 140 simultaneously compensate for the threshold voltage of the driving transistor during the second period T2. In a case where the pixels 142 simultaneously compensate for the threshold voltage of the driving transistor as described above, the second period T2 can be sufficiently ensured, and accordingly, it is possible to stably compensate for the threshold voltage of the driving transistor. That is, in a case where the pixel unit 140 is driven at a high speed of 120 Hz or more, the second period T2 can also be sufficiently ensured, thereby stably compensating for the threshold voltage of the driving transistor.

Hereinafter, an embodiment of the pixel 142 shown in FIG. 1 and a driving method of the pixel 142 will be described in detail with reference to FIGS. 2 and 3.

Figure 2:
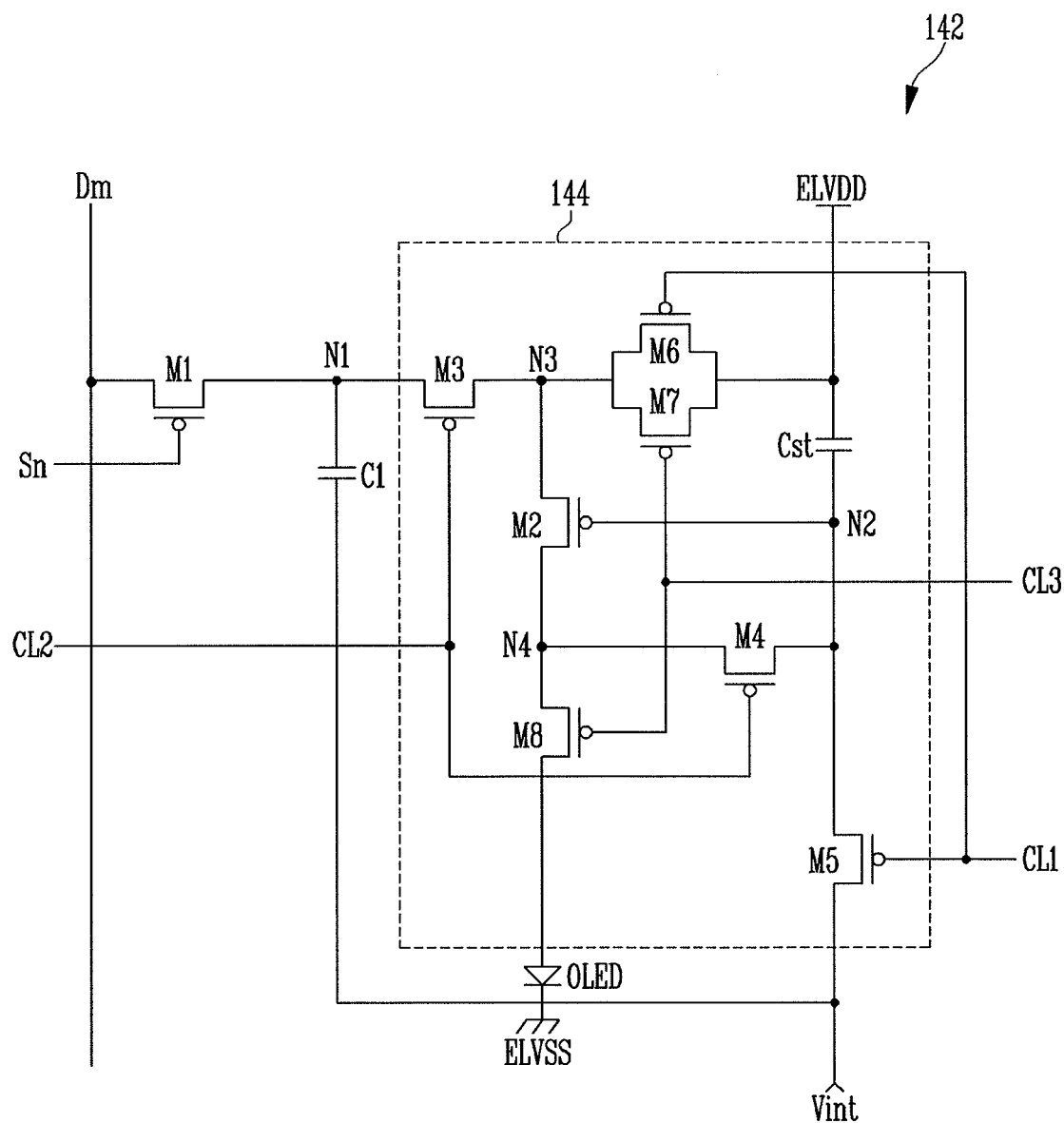
FIG. 2 illustrates a circuit diagram of a structure of a pixel shown in FIG. 1.

FIG. 2 illustrates a circuit diagram of the pixel 142. Referring to FIG. 2, the pixel 142 according to this embodiment may include a first transistor M1, a first capacitor C1, a pixel circuit 144, and an organic light emitting diode OLED.

An anode electrode of the organic light emitting diode OLED is coupled to the pixel circuit 144, and a cathode electrode of the organic light emitting diode OLED is coupled to the second power source ELVSS. The organic light emitting diode OLED emits light with a predetermined luminance corresponding to the amount of current supplied from the pixel circuit 144.

A first electrode of the first transistor M1 is coupled to a data line Dm, and a second electrode of the first transistor M1 is coupled to a first node N1 coupled to the pixel circuit 144. A gate electrode of the first transistor M1 is coupled to a scan line Sn. The first transistor M1 is turned on when a scan signal is supplied to the scan line Sn.

The first capacitor C1 is coupled between the first node and the initialization power source Vint. The first capacitor C1 is charged with a voltage corresponding to a data signal. Here, the initialization power source Vint is commonly applied to the pixels 142 respectively through the plurality of the initialization power line p1 to pm, and may be set to a voltage (e.g., 0V) lower than that of the data signal.

The pixel circuit 144 charges a voltage supplied from the first capacitor C1, i.e., a predetermined voltage corresponding to the voltage of the data signal. The pixel circuit 144 controls the amount of current supplied from the first power source ELVDD to the organic light emitting diode OLED, corresponding to the charged voltage.

In this embodiment, the pixel 142 may include second to eighth transistors M2 to M8 and a storage capacitor Cst.

A first electrode of the second transistor M2 as a driving transistor is coupled to a third node N3, and a second electrode of the second transistor M2 is coupled to a fourth node N4. A gate electrode of the second transistor M2 is coupled to a second node N2. The second transistor M2 controls the amount of current supplied to the organic light emitting diode OLED, corresponding to a voltage applied to the second node N2.

A first electrode of the third transistor M3 is coupled to the first node N1, and a second electrode of the third transistor M3 is coupled to the third node N3. A gate electrode of the third transistor M3 is coupled to a second control line, so that the second control signal CL2 is applied to the second control line. The third transistor M3 is turned on when the second control signal CL2 is supplied to the second control line, to allow the first and third nodes N1 and N3 to be electrically coupled to each other.

A first electrode of the fourth transistor M4 is coupled to the fourth node N4, and a second electrode of the fourth transistor M4 is coupled to the second node N2. A gate electrode of the fourth transistor M4 is coupled to the second control line, so that the second control signal CL2 is applied to the second control line. The fourth transistor M4 is turned on when the second control signal CL2 is supplied to the second control line, to allow the second and fourth nodes N2 and N4 to be electrically coupled to each other. If the second and fourth nodes N2 and N4 are electrically coupled to each other, the second transistor M2 is diode-coupled.

A first electrode of the fifth transistor M5 is coupled to the second node N2, and a second electrode of the fifth transistor M5 is coupled to the initialization power source Vint. A gate electrode of the fifth transistor M5 is coupled to a first control line, so that the first control signal CL1 is applied to the first control line. The fifth transistor M5 is turned on when the first control signal CL1 is supplied to the first control line, to supply the voltage of the initialization power source Vint to the second node N2.

A first electrode of the sixth transistor M6 is coupled to the first power source ELVDD, and a second electrode of the sixth transistor M6 is coupled to the third node N3. A gate electrode of the sixth transistor M6 is coupled to a first control line, so that the first control signal CL1 is applied to the first control line. The sixth transistor M6 is turned on when the first control signal CL1 is supplied to the first control line, to supply the voltage of the first power source ELVDD to the third node N3.

A first electrode of the seventh transistor M7 is coupled to the first power source ELVDD, and a second electrode of the seventh transistor M7 is coupled to the third node N3. A gate electrode of the seventh transistor M7 is coupled to a third control line as an emission control line so that the third control signal CL3 is applied to the third control line. The seventh transistor M7 is turned off when the third control signal CL3 as an emission control signal is supplied to the third control line, and is turned on when the emission control signal is not supplied.

A first electrode of the eighth transistor M8 is coupled to the fourth node N4, and a second electrode of the eighth transistor M8 is coupled to the anode electrode of the organic light emitting diode OLED. A gate electrode of the eighth transistor M8 is coupled to the third control line, so that the third control signal CL3 is applied to the third control line. The eighth transistor M8 is turned off when the emission control signal CL3 is supplied to the third control line, and is turned on when the emission control signal is not supplied.

The storage capacitor Cst is coupled between the first power source ELVDD and the second node N2. The storage capacitor Cst charges a voltage corresponding to the data signal and the threshold voltage of the second transistor M2, corresponding to the voltage charged in the first and second capacitors C1 and C2.

Figure 3:
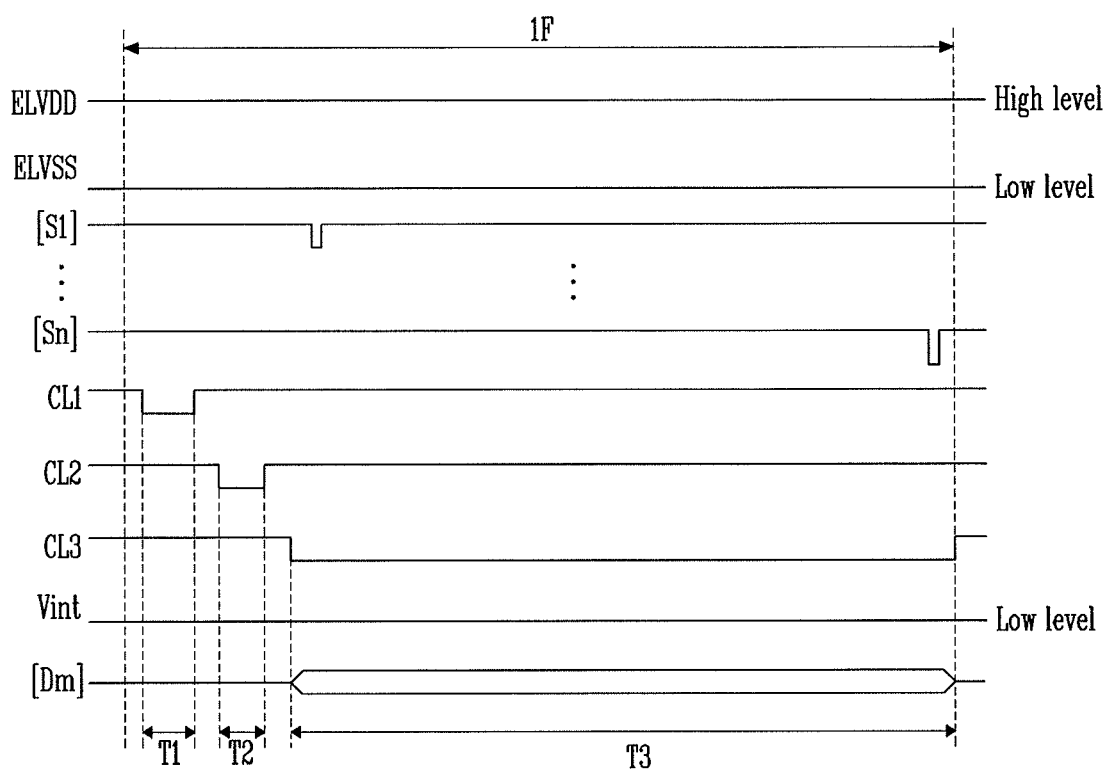
FIG. 3 illustrates a waveform diagram of a driving method of the pixel shown in FIG. 2.

FIG. 3 illustrates a waveform diagram of a driving method of the pixel 142. Referring to FIG. 3, one frame in the driving method according to this embodiment is divided into a first period T1, a second period T2, and a third period T3.

The first period T1 is an initialization period, in which the voltage of the initialization power source is supplied to the second node N2, i.e., the gate electrode of the driving transistor M2. The second period T2 is a compensation period, in which the threshold voltage of the second transistor M2 is compensated. The third period T3 is an emission and data writing period, in which a voltage corresponding to the data signal is charged in the first and second capacitors C1 and C2, and simultaneously, the organic light emitting diode OLED emits light with a predetermined luminance.

First, the emission control signal CL3 is supplied to the third control line during the first and second periods T1 and T2, and is not supplied during the third period T3. If the emission control signal CL3 is supplied to the third control line during the first and second periods T1 and T2, the seventh and eighth transistors M7 and M8 are turned on. Then, the second transistor M2 and the organic light emitting diode OLED are electrically decoupled from each other, and accordingly, the organic light emitting diode OLED is set in the non-emission state during the first and second periods T1 and T2.

The first control signal CL1 is supplied to the first control line during the first period T1. If the first control signal CL1 is supplied to the first control line, the fifth and sixth transistors M5 and M6 are turned on. If the fifth transistor M5 is turned on, the voltage of the initialization power source Vint is supplied to the second node N2. If the sixth transistor M6 is turned on, the voltage of the first power source ELVDD is supplied to the third node N3. Here, the initialization power source Vint is set to a voltage lower than that of the data signal, and hence the first transistor M1 is set in an on-bias state during the first period T1.

The second control signal CL2 is supplied to the second control line during the second period T2. If the second control signal CL2 is supplied to the second control line, the third and fourth transistors M3 and M4 are turned on.

If the fourth transistor M4 is turned on, the second transistor M2 is diode-coupled. If the third transistor M3 is turned on, the voltage of the data signal, stored in the first capacitor C1, is supplied to the third node N3. In this case, the voltage applied to the second node N2 is initialized as the voltage of the initialization power source Vint, which is lower than that of the data signal, and hence the second transistor M2 is turned on. If the second transistor M2 is turned on, the voltage applied to the third node N3 is supplied to the second node N2 via the diode-coupled second transistor M2. In this case, the storage capacitor Cst stores a voltage corresponding to the data signal and the threshold voltage of the second transistor M2.

The supply of the emission control signal CL3 to the third control line is stopped during the third period T3. If the supply of the emission control signal CL3 to the third control line is stopped, the seventh and eighth transistors M7 and M8 are turned on. If the seventh transistor M7 is turned on, the first power source ELVDD and the third node N3 are electrically coupled to each other. If the eighth transistor M8 is turned on, the fourth node N4 is electrically coupled to the organic light emitting diode OLED. Then, the second transistor M2 controls the amount of current flowing from the first power source ELVDD to the second power source ELVSS via the organic light emitting diode OLED, corresponding to the voltage applied to the second node N2. In this case, the organic light emitting diode OLED generates light with a predetermined luminance, corresponding to the amount of current supplied thereto.

Meanwhile, scan signals [S1] to [Sn] are progressively supplied to the scan lines S1 to Sn during the third period T3. If the scan signals are progressively supplied to the scan lines S1 to Sn, the first transistor M1 included in each pixel 142 positioned on each horizontal line is turned on. If the first transistor M1 is turned on, a data signal [Dm] from a data line (any one of the data lines D1 to Dm) is supplied to the first node N1 included in each pixel 142. In this case, the first capacitor C1 charges a voltage corresponding to the data signal. Actually, in an embodiment, a predetermined image is displayed by repeating the aforementioned procedure.

Meanwhile, although embodiments were described above with reference to P-type transistors for convenience of illustration, embodiments are not limited thereto. In other words, the transistors may be formed as N-type transistors.

In an embodiment, the organic light emitting diode OLED may generate red, green, and blue light, corresponding to the amount of current supplied from the driving transistor M2. However, embodiments are not limited thereto. For example, the organic light emitting diode OLED may generate white light, corresponding to the amount of the current supplied from the driving transistor. In this case, a color image is implemented using a separate color filter, etc.

In the display device according to this embodiment described with reference to FIGS. 1 to 3, the first control lines a1 to an, the second control lines b1 to bn, the third control lines c1 to cn, and the initialization power lines p1 to pm having the initialization power source Vint applied thereto are commonly coupled to the pixels 142. Accordingly, the same first to third control signal CL1 to CL3 and the same initialization power source are commonly applied to each pixel 142. That is, in order to display an image with uniform image quality through the pixels, the first to third control signals and the initialization power source, which have the same voltage, are necessarily supplied to each pixel.

However, there may occur a voltage drop (IR drop) in which the voltages of the first to third control signals and the initialization power source, which are supplied to each pixel, become different from one another due to a difference in length between inlet pads of respective voltage inputs and a difference in length between the first control lines a1 to an, the second control lines b1 to bn, the third control lines c1 to cn, and the initialization power lines p1 to pm. In the voltage drop, as the area of the pixel unit becomes large, the lengths of the lines increases, and therefore, variation in luminance between the pixels may increase.

In detail, in this embodiment, the initialization power source Vint, as shown in FIG. 2, is applied to one terminal of the first capacitor C1 provided in each pixel. In this case, the first capacitor C1 charges a voltage corresponding to the data signal applied to each pixel for each frame. Hence, if the initialization power source Vint is not constantly applied to all the pixels, a Mura-type defect may occur due to the variation in luminance for each pixel.

Accordingly, in this embodiment, in an initialization power source and/or control signals, the difference in resistance between the plurality of initialization power lines and/or control lines, which are electrically coupled to each inlet pad to which the initialization power source and/or the control signals are applied, is minimized. Therefore, the non-uniformity of luminance may be reduced.

Hereinafter, a structure according to an embodiment, through which the problem of luminance variation can be overcome, will be described in detail with reference to FIGS. 4A to 6. For convenience of illustration, the structure and coupling relationship of the initialization power lines p1 to pm commonly coupled to the pixels 142 and the inlet pads for providing the initialization power source Vint to the initialization power lines will be described in the embodiment shown in FIGS. 4 to 6. That is, the coupling structure of the first to third control lines and the inlet pads for respectively providing control signals to the first and third control lines may be substantially equal to the structure shown in FIGS. 4 to 6.

Figure 4A:
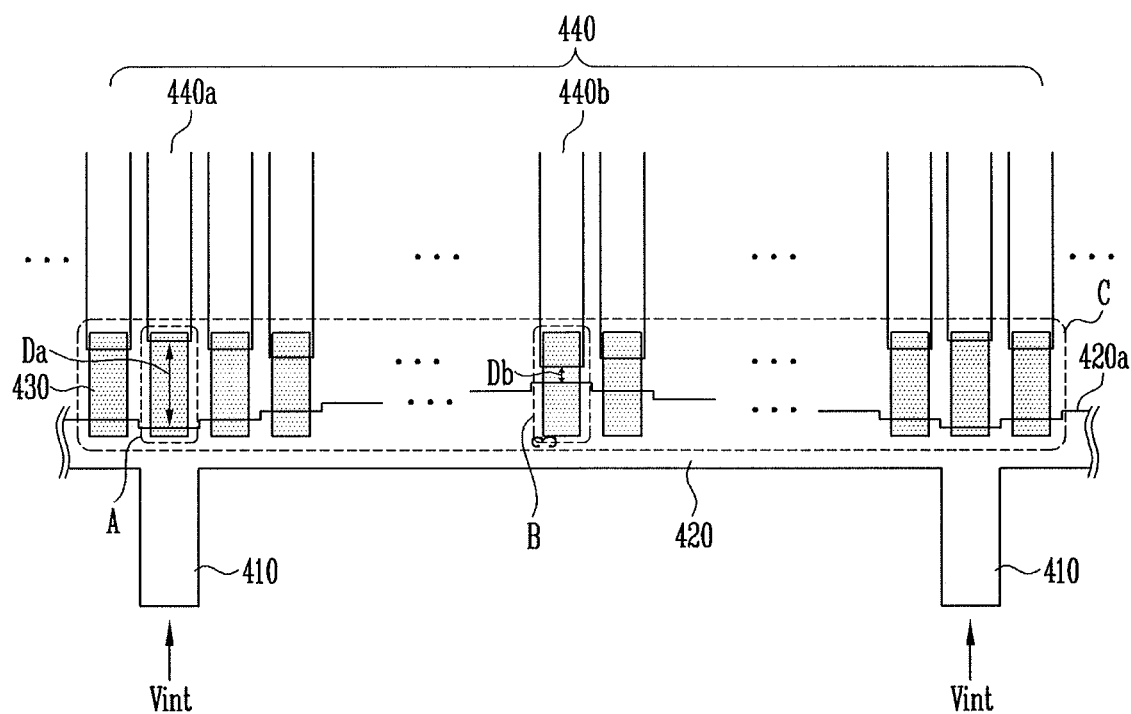
FIGS. 4A and 4B illustrate schematic plan views of inlet pads for commonly applying an initialization power source to the pixels shown in FIG. 1 and a plurality of power lines electrically coupled to the inlet pads.
Figure 4B:
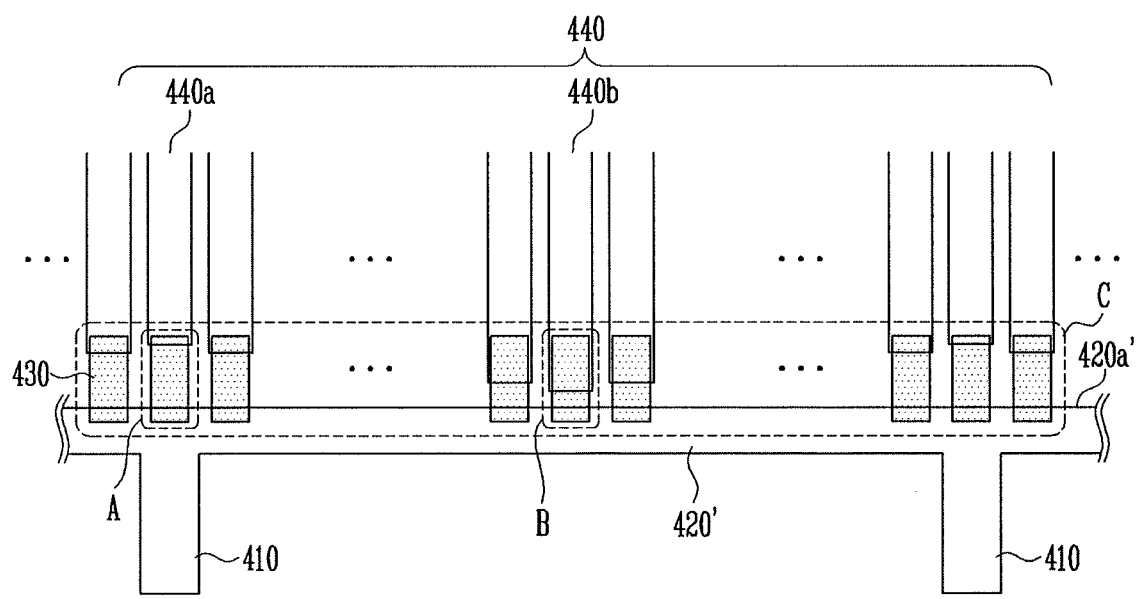
Figure 5:
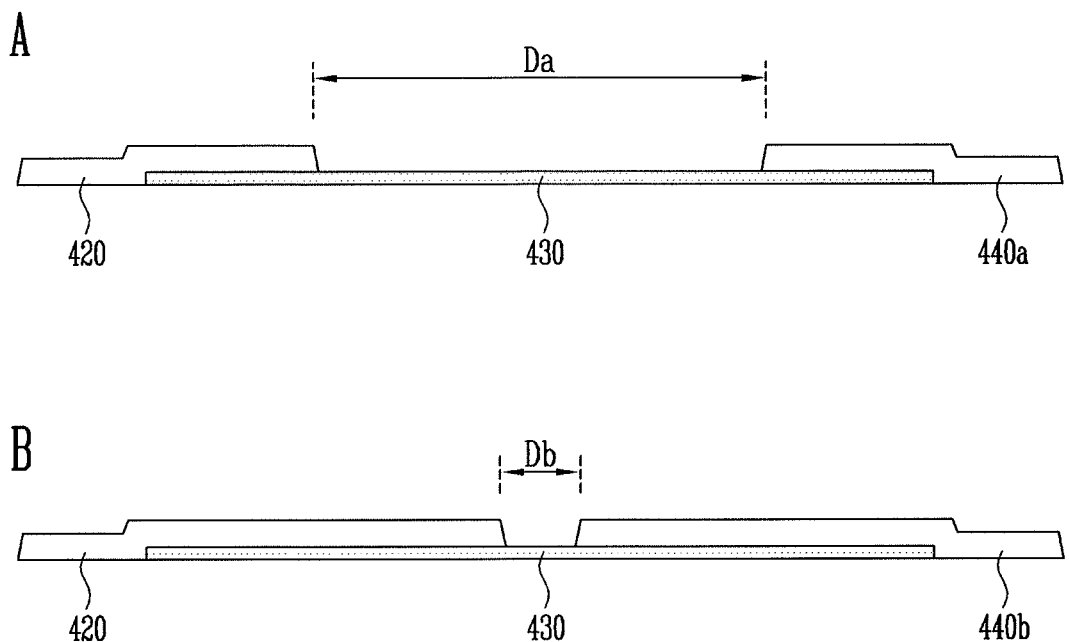
FIG. 5 illustrates a sectional view of specific regions A and B of FIG. 4A.
Figure 6:
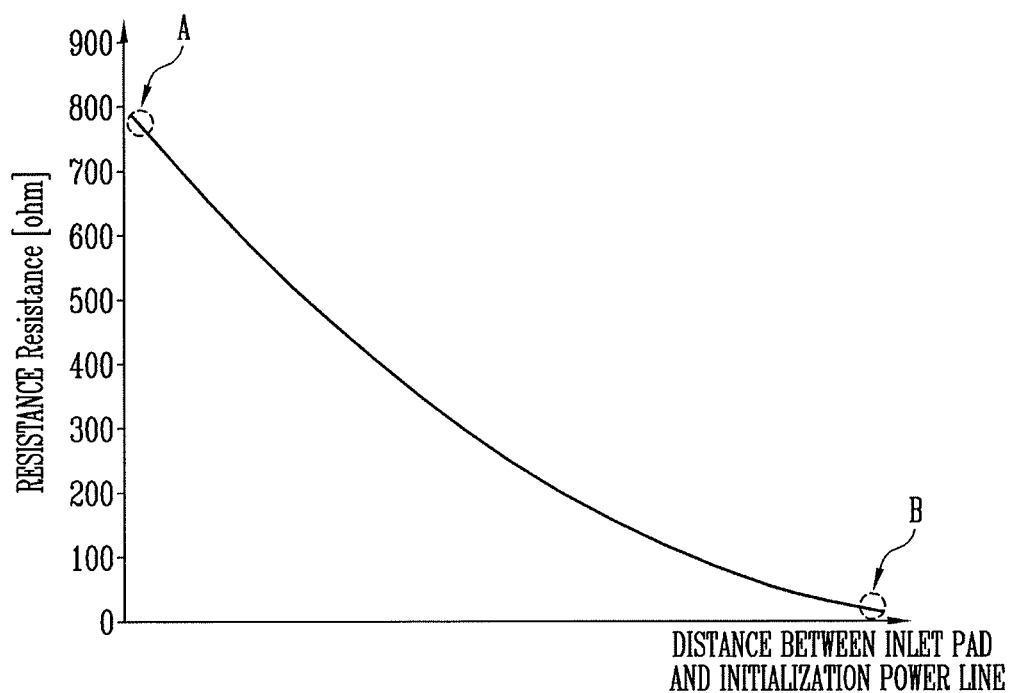
FIG. 6 illustrates a graph of resistance in a specific region C of FIG. 4A.

FIGS. 4A and 4B illustrate plan views schematically illustrating a structure of inlet pads for commonly applying the initialization power source Vint to the pixels 142 and the plurality of power lines p1 electrically coupled to the inlet pads. FIG. 5 illustrates a sectional view of specific regions A and B of FIG. 4A. FIG. 6 illustrates a graph illustrating resistance in a specific region C of FIG. 4A.

First, referring to FIG. 4A, the display device according to embodiments may further include a plurality of inlet pads 410 and a pad bar 420 in an outer area of the pixel unit 140 (FIG. 1). The initialization power source Vint is applied to the plurality of inlet pads 410, and the pad bar 420 extends in a first direction to be commonly coupled to the inlet pads 410.

As shown in FIG. 4A, the inlet pads 410 and the pad bar 420 may be integrally formed. For example, the inlet pads 410 and the pad bar 420 may be formed of a low-resistance metal material.

A plurality of initialization power lines 440, i.e., the initialization power lines p1 to pm, is positioned to be spaced apart from the pad bar 420, e.g., the initialization power lines 440 may be spaced apart from the pad bar 420 along a second direction perpendicular to the first direction. The plurality of initialization power lines 440 extends in the second direction toward the pixel unit 140 in order to supply the initial power source to the pixels 142.

The initialization power lines 440 are arranged to commonly apply the same initialization power source to all the pixels 142. According to the embodiment shown in FIG. 1, the initialization power lines p1 to pm may be arranged in parallel to the respective data lines D1 to Dm. For example, the pad bar 420 may extend continuously to extend along all the power lines 440.

In addition, island-shaped coupling patterns 430 respectively contacted with the initialization power lines 440 are formed to electrically couple the initialization power lines 440 to the pad bar 420. That is, the coupling patterns 430 are formed to be respectively contacted with end portions of the initialization power lines 440 and with an end portion of the pad bar 420, so that the initialization power lines 440 and the pad bar 420 are electrically coupled to each other through the coupling patterns 430.

In this case, the coupling patterns 430 are formed of a material having resistance higher than that of the pad bar 420 formed of the low-resistance metal material and the initialization power lines 440. For example, the coupling patterns 430 may be formed of a highly concentrated doped semiconductor.

Through the configuration shown in FIG. 4A, the initialization power source Vint applied to the inlet pads 410 is applied to the initialization power lines 440 through the pad bar 420 and the coupling patterns 430.

When comparing the region A closest to the inlet pad 410 with the region B most distant from the inlet pad 410, i.e., a central portion between adjacent inlet pads 410, a difference in resistance may exist due to the difference in length between current paths through which the initialization power source Vint is applied. That is, the resistance in region A, which is closest to the inlet pad 410, is smaller than the resistance in region B, which is the most distant from the inlet pad 410.

In order to minimize the difference in resistance in the plurality of initialization power lines 440 electrically coupled to the inlet pads 410, the resistance is increased in the region A closest to the inlet pad 410, and the resistance is decreased in the region B that is distant from the inlet pad 410. That is, in order to minimize the difference in resistance, shapes, e.g., lengths, of the end portions of the initialization power lines 440 and the pad bar 420, which are contacted with the coupling pattern 430, are controlled as shown in FIG. 4A.

In detail, referring to FIG. 4A, the coupling pattern 430 is formed so that areas of end portions of an initialization power line 440a and the pad portion 420 overlapping the coupling pattern 430 are minimized in the region A, i.e., the region of which resistance is smallest. In addition, the coupling pattern 430 is formed so that areas of end portions of an initialization power line 440b and the pad portion 420 overlapping the coupling pattern 430 are maximized in the region B, i.e., the region of which resistance is largest. That is, contact areas of the end portions of the initialization power lines 440 and the pad portion 420 with each coupling pattern 430 are formed smallest in the region A and largest in the region B.

For example, end portions of each one of the initialization power lines 440 overlapping with the coupling patterns 430 may be formed in a step shape, and portions of an edge 420a of the pad portion 420 overlapping with the coupling patterns 430 may be formed in a step shape, e.g., step pattern. For example, the step shape of the end portions of the initialization power lines 440 and portions of the edge 420a of the pad portion 420 may be defined by the overlap area between the coupling patterns 430 and the corresponding initialization power lines 440 and the pad portion 420, and may be adjusted to have larger step shapes, e.g., larger area of step patterns, in regions farthest from respective inlet pads 410 than areas closest to respective inlet pads 410. For example, areas of the overlapped end portions of the initialization power lines 440 and portions of the edge 420a of the pad portion 420 are gradually increased from the region A closest to the inlet pad 410 to the region B most distant from the inlet pad 410, as shown in FIG. 4A. For example, the contact areas between each coupling pattern 430 and corresponding initial power lines 440 and pad portion 420 increase as a distance from a coupling pattern 430 to a corresponding closest inlet pad 410 increases, so the contact areas between a coupling pattern 430 and corresponding initial power line 440 and pad portion 420 is a smallest at a coupling pattern 430 directly adjacent to, e.g., aligned with, the corresponding closest inlet pad 410, and is a largest at a coupling pattern 430 farthest from the corresponding closest inlet pad 410, e.g., a center portion between two adjacent inlet pads 410.

That is, referring to the sectional view of FIG. 5, in the coupling pattern 430 positioned in the region A, a length Da of a region not overlapped with the initialization power line 440a and the pad bar 420 is longer than a length Db of a region not overlapped with the coupling pattern 430 and the pad bar 420 in the region B. Therefore, since the overlap region of the coupling pattern 430 in region A is smaller than in region B, i.e., a non-overlapping length Da between an edge of the pad bar 420 and a facing edge of a corresponding initialization power line 440a/440b is larger than a non-overlapping length Db, the resistance of the coupling pattern 430 positioned in the region A is larger than that in region B. This is because the resistance of the material of the coupling pattern 430 is greater than that of the initialization power line 440a and the pad bar 420, and its length is larger in region A.

FIG. 6 illustrates a graph showing resistance in a specific region C of FIG. 4A. The region C reflects resistances of the coupling patterns 430 coupled to the pad bar 420 shown in FIG. 4A and the plurality of the initialization power lines 440 respectively coupled to the coupling patterns 430.

Referring to FIG. 6, the resistance (about 800Ω) of the coupling patterns 430 in the region A closest to the inlet pad 410 is largest, and the resistance (about 10Ω) of the coupling patterns 430 in the region B most distant from the inlet pad 410 is smallest. Thus, according to the present embodiment, varying the resistances of the coupling patterns 430 in accordance with the different resistances due to the different lengths of current paths through the pad bar 420 may control the resistance of the initialization power lines 440, thereby minimizing the difference in resistance among the plurality of initialization power lines 440 electrically coupled to the respective inlet pads 410, and thereby reducing the non-uniformity of luminance.

According to another embodiment, end portions of only one of the initialization power lines 440 and the pad bar 420 may be step shaped to control the resistance, as will be explained in detail with reference to FIG. 4B. The configuration and operation of the embodiment of FIG. 4B are substantially identical to those of the embodiment of FIG. 4A, except that the structure of a pad bar 420' is different from that of the pad bar 420. Therefore, components identical to those of the embodiment of FIG. 4A are designated by like reference numerals, and their detailed descriptions will be omitted.

Referring to FIG. 4B, unlike the embodiment of FIG. 4A, an end portion 420a' of the pad bar 420, which overlaps the plurality of coupling patterns 430, is not formed in a step shape but formed in a straight line shape. In this case, the areas of the coupling patterns 430 overlapping the end portion 420a' of the pad portion 420' are equal to one another.

However, like the embodiment of FIG. 4A, end portions of the initialization power lines 440 respectively coupled to the plurality of coupling patterns 430 are formed in a step shape, in which the areas of the overlapped end portions are gradually increased from the region A closest to the inlet pad 410 to the region B most distant from the inlet pad 410. Thus, according to the embodiment of FIG. 4B, the resistance of the region A closest to the inlet pad 410 is largest, and the resistance of the region B most distant from the inlet pad 410 is smallest.

Although not shown in these figures, as another embodiment, the end portions of the initialization power lines 440 respectively overlapped with the plurality of coupling patterns 430 may have the same length, and the end portion of the pad bar 420 overlapped with the coupling patterns 430 may be formed in a step shape. In this case, the resistance of the region A closest to the inlet pad 410 is largest, and the resistance of the region B most distant from the inlet pad 410 is smallest.

By way of summation and review, in an organic light emitting display device, the emission luminance of each pixel may be influenced by the voltage level of a control signal and/or a power source, applied to the pixels. That is, the control signal and/or the power source become(s) a primary factor that determines the emission luminance of the pixels, in addition to a data signal. Therefore, in order to display an image with uniform image quality, the control signal and/or the power source with the same voltage are(is) necessarily supplied to each pixel.

However, there may occur a voltage drop (IR drop) in which the voltages applied to the respective pixels become different from one another due to a difference in length between lines coupled to the respective pixels. For example, as a display panel of the display device becomes large, lengths of the lines are lengthened, and therefore, the luminance variation between the pixels may increase according to distances of the pixels from the pad receiving the control signal and/or the power source.

Therefore, according to the display device of the exemplary embodiments, in a power source and/or control signals commonly applied to the pixels, the difference in resistance between the plurality of power lines and/or control lines, which are electrically coupled to each inlet pad to which the power source and/or the control signals are applied, is minimized, thereby reducing a local non-uniformity of luminance in the display panel.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:
1. A display device, comprising:
a pixel unit including a plurality of pixels, the plurality of pixels being coupled to a plurality of control lines and to a plurality of power lines to commonly receive same control signals and power source;
at least one inlet pad positioned outside the pixel unit, at least the one inlet pad being configured to apply the power source to the plurality of power lines;
a pad bar electrically coupling at least the one inlet pad; and
a plurality of coupling patterns contacting end portions of the plurality of power lines and corresponding end portions of the pad bar, the plurality of coupling patterns electrically connecting the plurality of power lines and the pad bar, and one or more of the end portions of the pad bar and the ends portions of the plurality of power lines have different contact areas with the plurality of coupling patterns.

2. The display device as claimed in claim 1, wherein the contact area is smallest in a coupling pattern closest to each inlet pad of at least the one inlet pad.

3. The display device as claimed in claim 1, wherein the contact area decreases as a distance between a coupling pattern and a corresponding inlet pad decreases.

4. The display device as claimed in claim 1, wherein the contact area is largest in a coupling pattern most distant from each inlet pad of at least the one inlet pad.

5. The display device as claimed in claim 1, wherein the contact area increases as a distance between a coupling pattern and a corresponding inlet pad increases.

6. The display device as claimed in claim 1, wherein the plurality of coupling patterns include a material having resistance greater than that of the pad bar and the plurality of power lines.

7. The display device as claimed in claim 6, wherein the plurality of coupling patterns include a doped semiconductor.

8. The display device as claimed in claim 1, wherein one or more of the end portions of the pad bar and the ends portions of the plurality of power lines have a step shape, the contact area in the step shape gradually increases from a region close to an inlet pad of at least the one inlet pad to a region distant from the inlet pad of at least the one inlet pad.

9. The display device as claimed in claim 1, wherein the power source is an initialization power source configured to be commonly applied to the plurality of pixels.

10. The display device as claimed in claim 1, comprising:
a plurality of second inlet pads positioned outside the pixel unit, the plurality of second inlet pads being configured to apply control signals to the plurality of control lines;
a second pad bar electrically coupling the plurality of second inlet pads; and
a plurality of second coupling patterns contacting end portions of the plurality of control lines and corresponding end portions of the second pad bar, the plurality of second coupling patterns electrically connecting the plurality of control lines and the second pad bar, and one or more of the end portions of the second pad bar and the ends portions of the plurality of control lines have different contact areas with the plurality of second coupling patterns.

11. The display device as claimed in claim 10, wherein the second coupling patterns include a material having resistance greater than that of the second pad bar and the control lines.

12. The display device as claimed in claim 10, wherein one or more of the end portions of the second pad bar and the ends portions of the plurality of control lines have a step shape, the contact area in the step shape gradually increases from a region close to an inlet pad of the plurality of second inlet pads to a region distant from the inlet pad of the plurality of second inlet pads.

13. The display device as claimed in claim 9, wherein each pixel includes:
   an organic light emitting diode having a cathode electrode coupled to a second power source;
   a first transistor coupled between a data line and a first node, the first transistor being turned on when a scan signal is supplied to a scan line;
   a first capacitor coupled between the first node and the initialization power source; and
   a pixel circuit configured to control the amount of current flowing from a first power source to the second power source via the organic light emitting diode in accordance with a voltage applied to the first node.

14. The display device as claimed in claim 13, wherein the pixel circuit further comprises:
   a third transistor coupled between the first node and a third node, the third transistor having a turn-on period not overlapped with that of the first transistor;
   a second transistor configured to control the amount of current from the first power source coupled via the third node to the organic light emitting diode coupled via a fourth node in accordance with a voltage applied to a second node;
   a fourth transistor coupled between the second and fourth nodes, the fourth transistor being simultaneously turned on or turned off with the third transistor; and
   a storage capacitor coupled between the second node and the first power source.

15. The display device as claimed in claim 14, wherein the pixel circuit further comprises:
   a fifth transistor coupled between the second node and the initialization power source, the fifth transistor having a turn-on period not overlapped with those of the first and third transistors;
   a sixth transistor coupled between the third node and the first power source, the sixth transistor being simultaneously turned on or turned off with the fifth transistor;
   a seventh transistor coupled in parallel to the sixth transistor between the third node and the first power source, the seventh transistor having a turn-on period overlapped with that of the first transistor; and
   an eighth transistor coupled between the fourth node and the organic light emitting diode, the eighth transistor being simultaneously turned on or turned off with the seventh transistor.

16. The display device as claimed in claim 1, wherein the pad bar extends continuously and perpendicularly to the plurality of power lines and to the plurality of coupling patterns, and a portion of the pad bar contacting the plurality of coupling patterns varies in size along a longitudinal direction of the pad bar.

17. The display device as claimed in claim 16, wherein the portion of the pad bar contacting the plurality of coupling patterns is continuous along all the coupling patterns, and contact areas between the pad bar and corresponding coupling patterns vary in size with respect to a distance from a corresponding inlet pad.

18. The display device as claimed in claim 16, wherein an edge of the pad bar facing and contacting the plurality of coupling patterns is non-linear, the non-linear edge defining the varying size of the portion of the pad bar contacting the plurality of coupling patterns.

19. The display device as claimed in claim 1, wherein the end portions of the pad bar overlap with corresponding coupling patterns to define the contact areas therebetween, and sizes of the overlap areas vary with respect to a distance from the at least one inlet pad.

20. The display device as claimed in claim 1, wherein a first distance between an edge of a power line contacting a corresponding coupling pattern and an edge of the pad bar contacting the same corresponding coupling pattern varies with respect to a second distance from the at least one inlet pad, the first and second distances extending along perpendicular directions.

* * * * *